Oct. 22, 1968 R. J. NIENHUIS 3,407,332

TRANSISTOR CIRCUIT-ARRANGEMENT

Filed Nov. 16, 1964

INVENTOR.
RIJKERT J. NIENHUIS

BY Frank R. Trifari

AGENT

United States Patent Office 3,407,332

Patented Oct. 22, 1968

3,407,332

TRANSISTOR CIRCUIT-ARRANGEMENT

Rijkert Jan Nienhuis, Mollenhutseweg, Nijmegen, Netherlands, assignor to North American Philips Company, Inc., New York, N.Y., a corporation of Delaware Filed Nov. 16, 1964, Ser. No. 411,359
Claims priority, application Netherlands, Nov. 14, 1963, 300,553
10 Claims. (Cl. 315—27)

ABSTRACT OF THE DISCLOSURE

A transistor deflection system including means for protecting the output transistor from avalanche breakdown during the flyback period. This is accomplished by deriving a control signal for the output transformer having a particular waveform that limits the collector voltage of the output transistor to a safe range. The control signal is produced by means of a circuit including a drive transistor having its emitter directly connected to one electrode of a capacitor. The other capacitor electrode is directly connected to the base and collector electrodes by means of first and second resistors, respectively. During flyback, the capacitor is discharged via said transistor and said resistors at a slow rate at the start of flyback, and at a faster rate thereafter. The circuit components are chosen to satisfy the expression:

$$R_bC_t/\alpha' R_cC_t$$

wherein $R_b$ and $R_c$ are the resistance values of said first and second resistors, $C_f$ is the capacitance of the capacitor, and $\alpha'$ is the current gain of the drive transistor.

This invention relates to transistor circuit-arrangements for producing a sawtooth current through a deflection coil. Circuits of this type usually comprise a supply voltage source, an output transistor having a collector circuit that includes the deflection coil, at least one driver transistor, a charging capacitor having one electrode connected to the driver transistor so that, during fly-back, the current through the capacitor also flows through the transistor, an ohmic resistor likewise connected to the charging capacitor so that the current flowing through the capacitor during the stroke of the sawtooth current also flows through the ohmic resistor, and means for applying a signal to the base of the driver transistor for periodically releasing the transistor during the fly-back period of the sawtooth current.

In the copending patent application filed May 12, 1964 under Ser. No. 366,843, now Patent No. 3,296,486, it has been stated that steps must be taken to ensure that the switching-off of the output transistor begins progressively at the beginning of a fly-back period so that the collector voltage does not become unduly high upon switching off. If such steps are omitted and the transistor, due to the considerably increasing collector voltage, is brought into the state of so-called avalanche conduction, the resulting reverse base current is liable to shorten the life of the output transistor.

In the copending application the desired result is obtained by using a blocking oscillator for generating the control signal for the output transistor. This type of oscillator always includes a transformer. The winding of the transformer included in the collector circuit of the transistor associated with the blocking oscillator provides, together with the resistor included in the base circuit, a control signal for the output transistor which varies almost linearly during fly-back. It is thus ensured that the collector voltage of the output transistor during the fly-back period increases to a substantially constant value which is as low as possible and preferably less than the value at which avalanche conduction occurs.

However, if a self-oscillating arrangement is used, or if the driver transistor for producing the control signal is controlled directly by means of so-called synchronizing pulses, the winding in the collector circuit of the driver transistor is no longer used and other means must be found to give the control signal a wave-form such that the output transistor is not switched to avalanche conduction.

To achieve this, a circuit arrangement according to the invention is characterized in that the emitter of the driver transistor is directly connected to an electrode of the charging capacitor and the means for applying the control signal to the driving transistor comprise an ohmic resistor having a resistance of $R_b$ ohms. Also the collector circuit of the driver transistor includes an ohmic resistor having a resistance of $R_c$ ohms and for which the following relationship must apply $R_bC_t/\alpha' > R_cC_t$, wherein $\alpha'$ is the current gain factor of the driver transistor and $C_t$ is the capacitance of the charging capacitor in farads.

In order that the invention may be readily carried into effect, several embodiments of circuit arrangements according thereto will now be described in detail, by way of example, with reference to accompanying diagrammatic drawing, in which.

Figure 1:
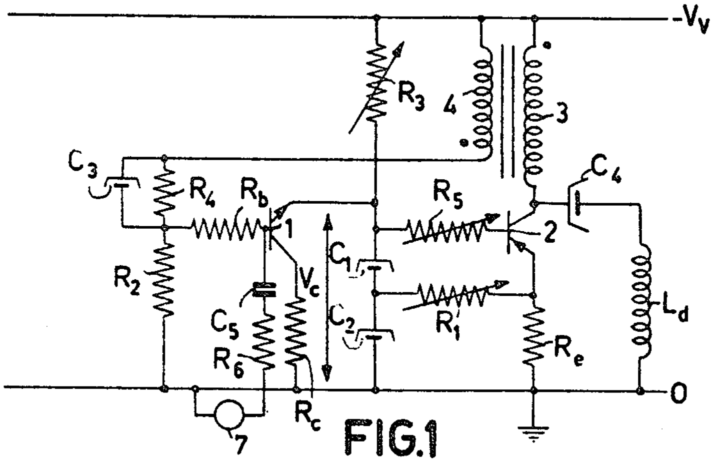
FIGURE 1 shows a self-oscillating transistorized image-deflection circuit including two transistors of opposite conductivity types.

In the circuit arrangement of FIGURE 1, the driver transistor 1 is of the n-p-n type and the output transistor 2 of the p-n-p type. The collector circuit of the output transistor 2 includes a choke 3 and its emitter circuit includes an emitter resistor $R_e$. The series combination of the emitter resistor $R_e$, the output transistor 2 and the choke 3 is connected between the terminals of a supply voltage source which provides a supply voltage of $V_v$ volts and the positive terminal of which is connected to ground. The collector circuit of transistor 2 also includes a deflection coil $L_d$ which is connected through a large capacitor $C_4$ to the collector of transistor 2.

The control signal for the output transistor 2 is produced by means of a charging circuit comprising a variable resistor $R_3$ for adjusting the frequency, and two charging capacitors $C_1$ and $C_2$ which have a total capacitance $$C_t=\frac{C_1C_2}{C_1+C_2}$$

Two capacitors $C_1$ and $C_2$ are used in order to improve the linearity of the control signal by means of feedback coupling from the emitter of transistor 2 to the common point of the capacitors $C_1$ and $C_2$ through a resistor $R_1$. The common point of resistor $R_3$ and capacitor $C_1$ is connected through a further variable resistor $R_5$ to the base of output transistor 2. The working range of the variable resistor $R_1$ is adjustable by means of the variable resistor $R_5$ in view of the current gain factor $\alpha'$ of the output transistor 2.

The charging capacitors $C_1$ and $C_2$ are charged through resistor $R_3$ from the supply voltage source to a value such that the voltage across the two capacitors is $V_{cb}$. The capacitors $C_1$ and $C_2$ being charged, discharge must follow through the driver transistor 1 and the collector resistor $R_c$ include in the collector circuit thereof. The discharge of the capacitors $C_1$ and $C_2$ sets in at a moment determined by the control signal derived from the winding 4, which is magnetically coupled to the choke 3, and applied through a capacitor $C_3$ to the base circuit of driver transistor 1. This base circuit also includes a voltage divider comprising ohmic resistors $R_2$ and $R_4$. The resistors $R_4$ is shunted by capacitor $C_3$ to permit proper transfer of the control signal derived from the winding 4 to the base circuit of driver transistor 1. The said base circuit also includes a resistor $R_b$ and a synchronizing circuit comprising a source 7 which provides the synchronizing pulses and which is likewise connected through a resistor $R_6$ and a capacitor $C_5$ to the base of drive transistor 1.

It will be evident that in normal operation of the circuit arrangement of FIGURE 1, the pulses applied through the winding 4 to the transistor 1 initiate the discharge of the capacitors $C_1$ and $C_2$. When this discharge is almost terminated, the transistor 2 again becomes conducting so that transistor 1 is again cut-off and the process of charging the capacitors $C_1$ and $C_2$ may start again.

As previously mentioned in the preamble, it is necessary to ensure that the control signal applied to the output transistor 2 at the beginning of the fly-back period, which coincides with the beginning of the discharge of the capacitors $C_1$ and $C_2$, has a wave-form such that the voltage at the collector of transistor 2 does not become unduly high. According to the principle of the invention this is achieved as follows:

Firstly, the emitter of the driver transistor 1 is directly connected to the series combination of the capacitors $C_1$ and $C_2$.

Secondly, the collector circuit of transistor 1 includes a collector resistor $R_c$.

Thirdly, the base circuit of the driver transistor 1 includes a base resistor $R_b$.

It may be explained as follows how it may be ensured by means of the said three steps that at the beginning of the fly-back the control signal has a wave-form such that the collector voltage of transistor 2 does not become excessive.

A pulse is derived from the winding 4 that releases the transistor 1 at the beginning of the fly-back period. The said pulse has an amplitude such that the common point of capacitor $C_3$ and resistor $R_2$ is brought almost to ground potential, or to a potential a little more positive than ground potential, so that transistor 1 conducts. However, due to the fact that a certain period must elapse before the required quantity of charge carriers is supplied to the base region of transistor 1, this transistor will not immediately convey its full current, but rather an initial base current will start to flow which is substantially equal to $V_c/R_b$ (emitter-base conducting) to which corresponds an initial emitter current approximately equal to $\alpha' V_c/R_b$. However, this initial emitter current has a sense such that the discharge of the capacitors $C_1$ and $C_2$ is initiated, that is to say a discharge current flows which is determined by the time constant $R_bC_t/\alpha'$ since the discharge current is influenced by the resistance of the base resistor $R_b$, but reduced $\alpha'$ times, because the initial base current is increased $\alpha'$ times as to its action on the discharge. That is to say the voltage $V_c$ which exists across the capacitors $C_1$ and $C_2$ will decrease according to an exponential function which varies according to the time constant $R_bC_t/\alpha'$. The variation of the exponential function is illustrated by curve 5 in FIGURE 2*a*. In this calculation the internal resistance of the transistor base-emitter circuit has been neglected since it is low relative to the resistor $R_b$.

At a given moment the voltage $V_c$ has fallen so much that $V_c$ becomes equal to $i_cR_c$, where $i_c$ is the collector current. That is to say the transistor 1 reaches its state of saturation (bottomed condition). In this condition transistor 1 may be regarded substantially as a switch so that the discharge current is then completely determined by the resistor $R_c$ included in the collector circuit of transistor 1. That is to say from the moment when transistor 1 has reached its saturated condition, the discharge current is no longer influenced by the base resistor $R_b$ but solely by the collector resistor $R_c$. In other words the discharge again proceeds according to an exponential function, but the variation in this exponential function is determined by the time constant $R_cC_t$. The variation in exponential function which is determined by the time constant $R_cC_t$ is illustrated by curve 6 in FIGURE 2*a*.

Figure 2A:
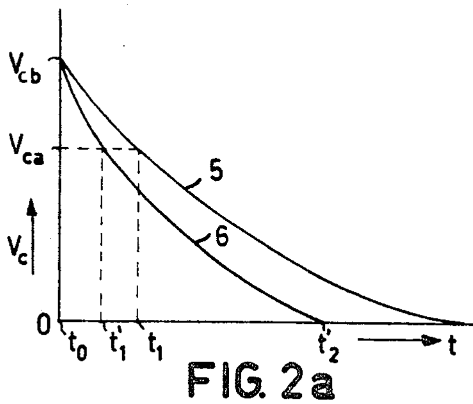
FIGURES 2A and 2B show curves to explain the operation of the circuit arrangement of FIGURE 1.
Figure 2B:
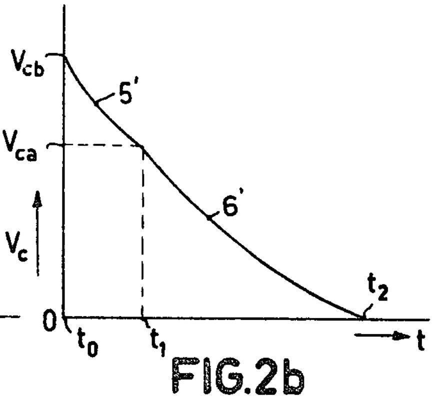

A comparison between the curves 5 and 6 shows that the slope of curve 5 is less than that of curve 6. This is achieved by choosing the time constant $R_bC_t/\alpha'$ to be longer than the time constant $R_cC_t$. The value of the time constant $R_bC_t/\alpha'$ also determines substantially the moment at which the transistor 1, after the discharge has set in, reaches its saturated condition. Assuming that $$k \cdot \frac{R_bC_t}{\alpha'} = t_1$$

wherein $k<1$ is a constant indicating that the time $t_1$ is a portion of the time determined by the time constant $R_bC_t/\alpha'$, and if the moment $t_0$ is the moment at which the discharge of the capacitors $C_1$ and $C_2$ begins, then the moment when the transistor 1 reaches its saturated condition is substantially equal to the lapse of time between $t_1$ and $t_0$ as shown in FIGURE 2*b*.

From this it follows that the discharge of the capacitors $C_1$ and $C_2$ proceeds from the moment $t_0$ to the moment $t_1$ with a slope which is determined by curve 5, and that this discharge proceeds from the moment $t_1$ to the complete discharge at the moment $t_2$ with a slope which is determined by curve 6. The foregoing is shown by the curves 5' and 6' in FIGURE 2*b*. The curve 5' has the same slope from the moment $t_0$ to $t_1$ as has the curve 5 in FIGURE 2*a* and the curve 6' has the same slope from the moment $t_1$ to the moment $t_2$ as has the curve 6 in FIGURE 2*a*. It must be considered that the discharge curve 6' begins at a voltage $V_{ca}$, to which value the voltage $V_c$ has decreased up to the moment $t_1$ so that curve 6' in FIGURE 2*b* corresponds to the porition of curve 6 in FIGURE 2*a* between the moments $t_1'$ and $t_2'$.

However, the voltage $V_c$ as shown in FIGURE 2*b* is the control voltage for the transistor 2 during the fly-back period. From this it follows that the base current of the output transistor 2 during the fly-back period will have a smaller slope from the moment $t_0$ to the moment $t_1$ than from the moment $t_1$ to the moment $t_2$ because the base current is determined by the control voltage $V_c$ across the capacitors $C_1$, $C_2$. However, if the base current has a smaller slope from the moment $t_0$ to the moment $t_1$, the collector current will also have a smaller slope. Since the voltage at the collector of transistor 2 during the fly-back period is determined almost completely by the equation $$V_c = -L_d \frac{di_c}{dt}$$

this collector voltage will also have a lower value since the collector current $i_c$ (determined by the base current $i_b$ which in turn is determined by the slope of curve 5') decreases in value as the slope of curve 5' becomes smaller. From the moment $t_1$ when the transistor 1 reaches its saturated condition, the base current of output transistor 2 will be determined by the voltage variation shown by curve 6', and hence the slope of the collector current of output transistor 2 will also vary from the moment $t_1$. This variation is such that the slope of the collector current increases slightly from the moment $t_1$ as compared with its slope just before the moment $t_1$, but by the method described hereinbefore, it is achieved that even from the moment $t_1$ the slope of the collector current is such that the collector voltage does not become so high that avalanche conduction occurs. This can actually be achieved as may be appreciated as follows: FIGURE 2*a* also shows the moment $t_1$ and from this it appears that the voltage $V_c$ at the moment $t_1$ has fallen to a value $V_{ca}$ so that curve 6, which becomes active at the moment $t_1$, need not decline from a value $V_{cb}$, which is the maximum voltage developed across the capacitors $C_1$ and $C_2$, but from a lower value $V_{ca}$. As a result, the initial slope of curve 6 at the moment $t_1$ will be smaller when starting from a value $V_{ca}$ than when starting from a value $V_{cb}$, as may be clearly seen from curve 6 in FIGURE 2*a*. In other words, due to the provision of resistor $R_b$, it is ensured not only that the slope of the collector current flowing through transistor 2 from the moment $t_0$ is smaller than in the absence of resistor $R_b$ (for then from the moment $t_0$ the collector current would also be determined by the slope of curve 6) but also that even from the moment $t_1$ the slope does not become excessive because the beginning of curve 6 is shifted to a later moment so that the voltage across the capacitors $C_1$ and $C_2$ has already decreased to the value $V_{ca}$. It can thus be achieved that the voltage at the collector of transistor 2 does not at any moment become so high that this output transistor assumes the state of avalanche conduction. Consequently, the transistor cannot be damaged due to avalanche conduction and consequent contraction effect.

It will be evident that the transition from curve 5' to curve 6' as shown in FIGURE 2*b* is not so abrupt as shown in the figure, for the collector current $i_c$ which flows through driver transistor 1 will progressively increase so that the transition of the discharge curve determined by the time constant $R_bC_t/\alpha'$ will progressively change to a discharge curve determined by the RC time $R_cC_t$. However, this does not alter the explanation given above, namely that the provision of resistor $R_b$ causes the slope of the collector current through transistor 2 to be reduced from the moment $t_0$ relative to the case where the resistor $R_b$ were zero.

One may, of course, wonder why the RC time $R_bC_t/\alpha'$ is not chosen to be such that the complete discharge of the capacitors $C_1$ and $C_2$ proceeds according to curve 5. This is not desirable for two reasons. Firstly, the total discharge time of the capacitors $C_1$ and $C_2$ would then be longer than the fly-back period available. If, for example, the circuit arrangement of FIGURE 1 would be used for deflecting an electron beam in a television receiver in the vertical direction, the fly-back period is 1 msec. and, at the desired slope of curve 5, the RC time $R_bC_t/\alpha'$ will be too long relative to 1 msec. Secondly, the fly-back period would then be determined by the current gain factor $\alpha'$ of the driver transistor 1. However, this current gain factor is temperature-dependent and dependent on tolerances since it has no constant value for arbitrary transistors of the same type. Therefore if the total fly-back period were determined by the last-mentioned RC time, the fly-back period would also be temperature-dependent and dependent on transistor tolerances and this is undesirable. Consequently, the time $R_bC_t/\alpha'$ must be such that the transistor $t_1$ reaches its bottomed condition at the desired moment and this moment ($t_1$ in the above example) must not be too far away from the moment $t_0$ but rather such that the collector voltage at transistor 2 never becomes so high as to cause avalanche conduction.

It will be evident that in the embodiment of FIGURE 1 the resistor $R_2$ also may be shunted by a capacitor, in the desired bias potential at the base of transistor 1. The capacitor $C_3$ is provided for the AC coupling from the winding 4 to the base of transistor 1. In the embodiment of FIGURE 1, the resistor $R_2$ has a value such that the desired transfer of the AC signal is effected if the resistor $R_4$ only is shunted by the capacitor. If this is not the case, the resistor $R_2$ also may be shunted by a capacitor, in which event the pulse originating from the winding 4 is applied through a capacitive voltage divider to resistor $R_b$ and through the latter to the base of transistor 1.

The possible values for a circuit arrangement as shown in FIGURE 1 when used for the deflection of an electron beam in a display tube of type AW 59–91 in the vertical direction, which display tube is of the 110° type and powered with a high voltage of 18 kilovolts, are the following:

transistor 1—AC 127
transistor 2—ASZ 15
$V_v$—12 volts
$L_d$—80 mH with ohmic resistance of 38Ω
choke 3—625 turns of wire 0.5 mm. in diameter
winding 4—1000 turns of wire 0.1 mm. in diameter
$R_e$—12 ohms
$R_1$—100 ohm potentiometer
$R_5$—100 ohm potentiometer
$R_3$—1500 ohm potentiometer
$R_2$—1500 ohms
$R_4$—2200 ohms
$R_b$—1000 ohms
$R_c$—10 ohms
$C_1$—80 μF
$C_2$—80 μF
$C_3$—0.15 μF.

Although in the foregoing the principle of producing the control voltage for transistor 2 has been described for a circuit arrangement of the self-oscillating type, it will be evident that this principle need not be confined to such an arrangement. Thus it is also readily applicable if the driver transistor 1 is directly controlled by synchronizing pulses. Such an example is shown in FIGURE 3 in which identical parts are indicated as far as possible in the same manner as in FIGURE 1.

Figure 3:
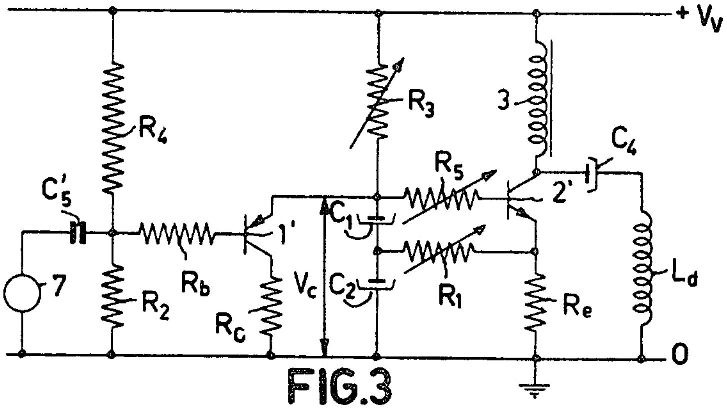
FIGURE 3 shows a second em bodiment in which a driver transistor is controlled directly by synchronizing pulses.

In the embodiment of FIGURE 3, the driver transistor and the output transistor are again of opposite conductivity types, but now the driver transistor 1' is of the p-n-p type and the output transistor 2' is of the n-p-n type. The circuit arrangement of FIGURE 3 otherwise differs from the arrangement of FIGURE 1 only in that the winding 4 is omitted and that the control pulses, which have to release transistor 1' during the fly-back period, are now obtained directly from a source 7, which provides the synchronizing pulses which are applied through a capacitor $C_5'$ to the resistor $R_b$. However, in the embodiment of FIGURE 3, the gate pulses from the source 7 must have a wave-form which differs from that in the embodiment of FIGURE 1, for in the embodiment first described the synchronizing pulses only had to initiate the discharge of the capacitors $C_1$ and $C_2$, whereafter the arrangement itself could maintain the discharge until it was completed. In the embodiment of FIGURE 3, however, the pulses obtained from the source 7 must have a duration equal to the discharge time of the capacitors $C_1$ and $C_2$, which discharge time in turn is substantially equal to the fly-back period of the sawtooth current which has to flow through the deflection coil $L_d$.

It should be noted that, although in the foregoing description the capacitors $C_1$ and $C_2$ have invariably been shown in parallel with the series combination of the drive transistor, and the collector resistor $R_c$, this is not strictly necessary. The charging capacitor, which in this case may comprise a single capacitor, may alternatively be connected in parallel with resistor $R_3$. This capacitor will then be charged by means of the current which flows through the transistors 1 and 1' respectively, which charging current must flow during the fly-back period. The capacitor will then be discharged through resistor $R_3$. This discharge time is then the stroke period of the sawtooth current flowing through the deflection coil $L_d$. The principle of the invention is not influenced thereby since the charging current through the capacitor which is connected in parallel with resistor $R_3$ is then determined by the curves 5' and 6' in a manner similar to that described for the discharge current through the capacitors $C_1$ and $C_2$ in the embodiment of FIGURE 1.

It will also be evident that, if the properties of the output transistor 2 are such that an additional amplifying stage is required between the capacitors $C_1$ and $C_2$ and the output transistor 2, such interposition of an additional amplifier in the form of a further transistor does not detract from the principle of the invention, for this principle is based on the production of the control voltage for the output transistor, which control voltage is produced by means of the capacitors $C_1$ and $C_2$, and the driver transistor 1 with its associated circuit elements.

To obtain a further improvement in linearity at low values for $\alpha'$ of transistor 2, that end of resistor $R_3$ which is connected to the negative terminal of the supply voltage source in the embodiment of FIGURE 1 may be connected to that end of the secondary winding 4 which is coupled to the parallel combination of resistor $R_4$ and capacitor $C_3$, so that the secondary winding 4 also has to fulfil a function during the stroke.

I claim:

1. A transistor circuit for producing a sawtooth current in a deflection coil comprising, a supply voltage source, an output transistor having a collector circuit which includes the deflection coil, at least one driver transistor, a capacitor having one electrode connected to the driver transistor so that during the fly-back period the capacitor current also flows through the driver transistor, an ohmic resistor connected to the capacitor so that the current flowing through the capacitor during the stroke period of the sawtooth current also flows through the ohmic resistor, means for applying a control signal to the base of the driver transistor for periodically causing conduction in said transistor during the fly-back period of the sawtooth current, means directly connecting the emitter of the driver transistor to one electrode of the capacitor, said means for applying the control signal comprising a second ohmic resistor having a resistance of $R_b$ ohms, a third ohmic resistor connected in the collector circuit of the driver transistor and having a resistance of $R_c$ ohms, the components of said transistor circuit being related to satisfy the expression: $R_bC_t/\alpha' > R_cC_t$, wherein $\alpha'$ is the current gain factor of the driver transistor and $C_t$ is the capacitance of the capacitor, and means for coupling the input electrode of said output transistor to said capacitor.

2. A transistor circuit as claimed in claim 1 wherein the capacitor and the first ohmic resistor are connected in series between the terminals of the supply voltage source so that said one electrode of the capacitor is connected to said first ohmic resistor and to the emitter of the driver transistor, and means connecting the other electrode of said capacitor to the free end of said third resistor.

3. A transistor circuit as claimed in claim 1 which is arranged to be self-oscillating and comprising, a coil connected in the collector circuit of the output transistor, said means for applying the control signal also including a winding magnetically coupled to said coil, a voltage divider comprising the series combination of two resistors, at least one of said two resistors being shunted by a second capacitor, means connecting said winding and the voltage divider in series between the terminals of the supply voltage source, and means connecting said second ohmic resistor between the common junction point of the two series-connected resistors of the voltage divider and the base of the driver transistor.

4. A transistor circuit as claimed in claim 1 wherein said driver transistor and said output transistor are of opposite conductivity type.

5. A transistor circuit as claimed in claim 1 further comprising means directly connecting the other electrode of said capacitor to the base and collector electrodes of said driver transistor by means of said second and third resistors, respectively.

6. A transistor circuit as claimed in claim 1 further comprising means for establishing a direct current connection between said second resistor and the base of the driver transistor.

7. A transistor circuit for producing a control signal for the output transistor of a deflection system comprising, a transistor having emitter, base and collector electrodes, a capacitor having one electrode directly connected to the emitter of said transistor, a first resistor connected to said capacitor to charge same during the stroke period of the sawtooth deflection current, a second resistor directly connected to the base of said transistor, a third resistor directly connected to the collector of said transistor, means for applying an electric signal to said base electrode to initiate current flow in said transistor during the flyback period, a circuit arrangement for discharging said capacitor during the flyback period, said circuit arrangement comprising means including said transistor and said second resistor for discharging said capacitor at a first given rate at the start of the flyback period and means including said transistor and said third resistor for discharging said capacitor at a second faster rate during a subsequent portion of the flyback period, and output means for coupling the control signal produced by said transistor circuit to the input of said output transistor.

8. A transistor circuit as claimed in claim 7 wherein said circuit arrangement includes means directly connecting the other electrode of said capacitor to said second and third resistors to provide first and second discharge paths for the capacitor, said first discharge path including said second resistor and the base-emitter path of the transistor, said second discharge path including said third resistor and the emitter-collector path of the transistor.

9. A transistor circuit as claimed in claim 8 wherein the circuit components are chosen to satisfy the expression:

$$R_bC_t/\alpha' > R_cC_t$$

wherein $R_b$ is the resistance of said second resistor, $R_c$ is the resistance of said third resistor, $\alpha'$ is the current gain factor of the transistor and $C_t$ is the capacitance of said capacitor.

10. A transistor circuit as claimed in claim 7 wherein said electric signal applying means includes said second resistor, said electric signal being of a magnitude and polarity to drive said transistor into saturation, said first given discharge rate occurring during the period that elapses between receipt of the electric signal and the instant the transistor reaches saturation, and said second discharge rate occurring during the period the transistor is in saturation.

References Cited

UNITED STATES PATENTS

| | | | |
|---|---|---|---|
| 2,939,040 | 5/1960 | Isabeau | 315—27 |
| 3,247,419 | 4/1966 | Attwood | 315—27 |
| 3,296,486 | 1/1967 | Nienhuis | 315—27 |
| 3,322,894 | 5/1967 | Keith | 315—27 |

ROBERT L. GRIFFIN, *Primary Examiner.*

R. K. ECKERT, *Assistant Examiner.*